United States Patent
Yeh et al.

(10) Patent No.: US 7,564,136 B2
(45) Date of Patent: Jul. 21, 2009

(54) INTEGRATION SCHEME FOR CU/LOW-K INTERCONNECTS

(75) Inventors: Ming Ling Yeh, Tainan (TW); Chen-Hua Yu, Hsin-Chu (TW); Keng-Chu Lin, Ping-Tung (TW); Tien-I Bao, Hsin-Chu (TW); Shwang-Ming Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 197 days.

(21) Appl. No.: 11/361,331

(22) Filed: Feb. 24, 2006

(65) Prior Publication Data

US 2007/0202676 A1 Aug. 30, 2007

(51) Int. Cl.
*H01L 23/48* (2006.01)

(52) U.S. Cl. .............. 257/773; 257/734; 257/774; 257/E29.111; 257/E23.01

(58) Field of Classification Search ............ 257/734, 257/773, 774, E23.01, E23.141, E29.111
See application file for complete search history.

(56) References Cited

U.S. PATENT DOCUMENTS

| | | | |
|---|---|---|---|
| 5,744,399 A | 4/1998 | Rostoker et al. | |
| 5,864,172 A | 1/1999 | Kapoor et al. | |
| 6,323,121 B1 | 11/2001 | Liu et al. | |
| 6,541,842 B2 | 4/2003 | Meynen et al. | |
| 6,756,321 B2 | 6/2004 | Ko et al. | |
| 6,759,325 B2 * | 7/2004 | Raaijmakers et al. | 438/633 |
| 6,787,453 B2 * | 9/2004 | Abell | 438/637 |
| 7,015,150 B2 * | 3/2006 | Cooney et al. | 438/765 |
| 7,135,402 B2 * | 11/2006 | Lin et al. | 438/639 |
| 7,256,499 B1 * | 8/2007 | You et al. | 257/758 |
| 2003/0087531 A1 * | 5/2003 | Kang et al. | 438/710 |
| 2003/0116854 A1 * | 6/2003 | Ito et al. | 257/761 |
| 2004/0097099 A1 | 5/2004 | Li et al. | |
| 2005/0098896 A1 | 5/2005 | Huang et al. | |
| 2005/0148209 A1 | 7/2005 | Chu et al. | |

OTHER PUBLICATIONS

Tada, M., et al., "A 65nm-node, Cu Interconnect Technology Using Porous SiOCH film (k=2.5) Covered with Ultra-thin, Low-k Pore Seal (k=2.7)," IEEE, Mar. 2003, four (4) pages.

* cited by examiner

*Primary Examiner*—Alexander G Ghyka
*Assistant Examiner*—Angel Roman
(74) *Attorney, Agent, or Firm*—Slater & Matsil, L.L.P.

(57) ABSTRACT

A semiconductor structure having an opening formed in a porous dielectric layer is provided. The exposed pores of the dielectric layer along the sidewalls of the opening are sealed. The sealing may comprise a selective or a non-selective deposition method. The sealing layer has a substantially uniform thickness in one portion of the opening and a non-uniform thickness in another portion of the opening. A damascene interconnect structure having a pore sealing layer is provided as is its method of manufacture.

19 Claims, 7 Drawing Sheets

INTEGRATION SCHEME FOR CU/LOW-K INTERCONNECTS

TECHNICAL FIELD

This invention relates generally to semiconductor manufacturing and more particularly to the formation and processing of semiconductor devices having porous dielectric layers.

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics, IMDs, and as interlayer dielectrics, ILDs. However, low-k materials present problems during processing, especially during the processing of the conductive material used to make interconnects.

The conductive material is typically patterned and etched using high-energy plasma etch processes. The low-k materials are susceptible to damage from a plasma etch because they are softer, less chemically stable or more porous, or any combination of these factors. The plasma damage can manifest itself in higher leakage currents, lower breakdown voltages, and changes in the dielectric constant associated with the low-k dielectric material.

One example of low-k dielectric materials are the porous dielectrics. Porous dielectrics may be formed by incorporating a pore generating material (a porogen) into a low-k dielectric matrix. One example of a low-k material is a carbon-doped oxide or organosilicate glass (OSG). Examples of commercially available porous dielectrics include Dow Chemical's SILK product and JSR Corporation's JSR 5109. The dielectric constant of the porous material is a combination of the dielectric constant of air and the dielectric constant of the low-k matrix material. Silica based xerogels and aerogels, for example, incorporate a large amount of air in pores or voids, thereby achieving dielectric constants less than 1.95 with pores as small as 5-10 nm.

Porous dielectrics are susceptible to damage from plasma etching and ashing processes used in deice fabrication. When there is an open pore in the dielectric, processing fluids in lap and polish and in thin film metallization can enter surface pores, thereby causing corrosion, mechanical damage, or an increase in the dielectric constant. Pore damage may also cause a surface that is preferably hydrophobic to become hydrophilic. A hydrophilic surface tends to absorb moisture, which further increases the dielectric constant.

Given the properties of porous dielectrics, conventional wet cleaning methods are particularly problematic. As cleaning fluids enter the pores, this causes higher leakage currents, lower breakdown voltages, and changes in the dielectric constant associated with the low-k dielectric material. In view of these and other problems, there is a need for improved low-k dielectric manufacturing methods.

SUMMARY OF THE INVENTION

These and other problems are generally solved or circumvented, and technical advantages are generally achieved, by preferred embodiments of the present invention that provides a semiconductor device fabrication process suitable for porous dielectrics.

In accordance with an embodiment of the invention, a method for forming semiconductor device is provided. The method comprises forming a porous dielectric layer, forming an opening in a surface the porous dielectric layer and forming a sealed pore layer over sidewalls of the opening. Preferably, a first region of sealed pore layer has a substantially uniform thickness, and a second region of the sealed pore layer has a substantially a non-uniform thickness.

In another embodiment of the invention, the method comprises providing a substrate having a conductive feature formed therein, forming a porous dielectric layer over the substrate, forming a first opening through the porous dielectric layer and exposing the conductive feature, forming a second opening within the first opening. Preferably a portion of the second opening is formed over the conductive feature. Embodiments further comprise forming a pore sealing layer over sidewalls of the first and second opening. Preferably, the pore sealing layer has a substantially non-uniform thickness over sidewalls of the first opening. Preferably, the pore sealing layer has a substantially nonuniform thickness over sidewalls of the first opening.

Still other embodiments of the invention provide a semiconductor device. The device comprises a conductive feature formed in a substrate, a porous dielectric layer over the substrate, a first opening through the porous dielectric layer exposing the conductive feature, a second opening within the first opening. Preferably, a portion of the second opening is formed over the conductive feature, and a pore sealing layer over sidewalls of the first and second opening. In preferred embodiments the pore sealing layer has a substantially non-uniform thickness over sidewalls of the first opening. The pore sealing layer may have a substantially non-uniform thickness over sidewalls of the first opening.

For embodiments of the invention, the pore sealing layer may comprise carbon-doped silicon dielectric such as $Si_xC_yO_z$, $Si_xC_yO_zH_{(1-x-y-z)}$, silicon carbide ($Si_xC_y$), carbon-doped silicon nitride ($Si_xC_yN_z$), $Si_xC_yH_z$, $Si_xO_yN_z$, and combinations of these materials, wherein $1 \leq (x, y, z) \leq 9$. Forming the pore sealing layer may comprise reacting a precursor material such as DEMS, TEOS, BCB, 3MS, 4MS, and combinations thereof using SACVD or PECVD. Preferably the pore sealing layer comprises a layer less than about 300 Å thick, and more preferably between about 20 Å and about 250 Å thick. Preferably, the etch selectivity of the pore sealing layer to the porous dielectric layer is about 1 to about 1.5, and the etch selectivity of the pore sealing layer to an etch stop layer is about 1.6 to about 1. For embodiments comprising a damascene interconnect structure the pore sealing layer has a substantially non-uniform thickness over sidewalls of the damascene interconnect via.

Yet other embodiments may comprise a surface treated layer interposed between the pore sealing layer and the sidewalls of the first and second opening. Preferably, the surface treated layer comprises a hydrogen radical treated layer. The hydrogen radical treating may also remove thin dielectric residue from the opening. The hydrogen radical includes hydrogen-containing species such as $NH_3^+$, $H^+$, $H_2$, and other species containing hydrogen.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts. The specific embodiments discussed herein are merely illustrative of specific ways to make and use the invention, and do not limit the scope of the invention.

The details of the invention will now be described in a specific context, namely a semiconductor device having a conventional damascene interconnect structure that further includes embodiments of the invention. Conventional damascenes interconnect structures and methods are described in U.S. Pat. No. 6,323,121, which patent is hereby incorporated by reference in its entirety. As will be seen from the description below, preferred embodiments of the invention provide structures and methods for removing processing residues from porous dielectric surfaces while simultaneously avoiding moisture uptake problems of conventional methods. One skilled in the art will recognize that many of the damascene interconnect details, as being only illustrative of embodiments, may be optionally substituted with other conventional damascene interconnect structures and methods without departing from the spirit and scope of the invention. Some steps may occur in a different order, and not all illustrated steps are required to implement the invention.

Figure 1:
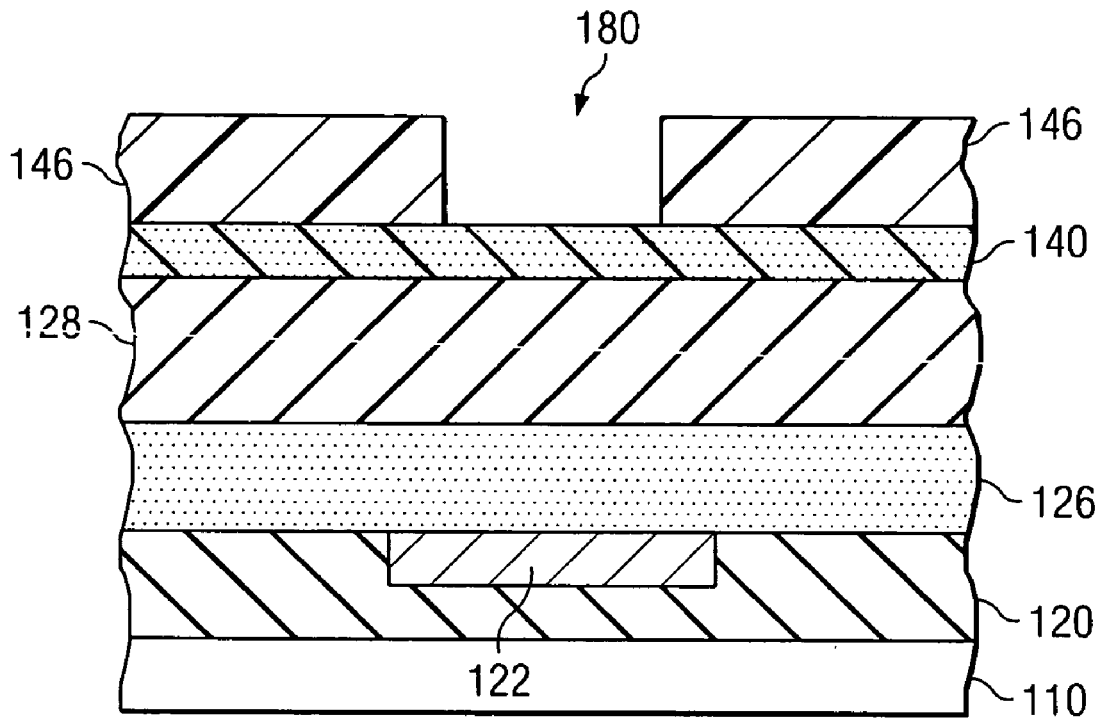
FIGS. 1-3 are cross sectional views illustrating steps in forming a dual damascene interconnect opening according to embodiments of the invention.

In an embodiment of the invention, a wafer substrate of semiconductor material, such as silicon is provided. Referring to FIG. 1, substrate 110 is provided with a substructure of devices formed in the substrate and/or metal layers thereof, and as they are well known in the art, they are not described in detail. An insulating layer 120 is formed on the substrate 110 and a copper wiring layer 122 is formed in the upper portion of the layer 120. The copper wiring layer 122 is shown embedded in the figure as it is formed by a damascene process. Alternately, the wiring layer 122 may comprise Al, Au, Ag, W, and combinations thereof. The surface of the insulating layer 120 and the embedded metal wiring 122 is planarized by CMP.

The copper wiring layer 122 may also be formed by another process. In the present embodiment the insulating layer 120 is preferably silicon oxide, although it may alternatively be formed of another insulating material, for example BPSG (borophosphosilicate glass), PSG (phosphosilicate glass), an organic polymer, an organosilicate glass, a fluorinated silicate glass, a xerogel, an aerogel, or a polysilsesquioxane. The insulating layer 120 is formed by chemical vapor deposition (CVD) although other deposition means may be used to deposit layer 120. However, PECVD (plasma enhanced chemical vapor deposition) or HDP (high density plasma enhanced chemical vapor deposition) is preferred because of the low deposition temperature. The wiring layer 122 is interconnected to elements of the devices located in the wafer 110 substructure.

An etch stop layer (ESL) 126 may be a single layer or multi-layers comprising carbon or nitrogen such as $Si_xC_y$, $Si_xC_yO_z$, $Si_xC_yN_z$, $Si_xC_yO_zH_{(1-x-y-z)}$, $Si_xN_y$ and $Si_xO_yN_z$, wherein $1 \leq (x, y, z) \leq 9$, deposited on the insulating layer 120 to a thickness of between about 350 and about 1,000 Angstroms. ESL materials may form the pore-sealed layer as well. Any number of well-known deposition methods may be employed to deposit the layer 126, which serves as an etch buffer layer during subsequent via etching and also as a chemical barrier.

A low-k dielectric layer 128 is next formed over the wafer 110. The low-k dielectric layer 128, preferably a porous dielectric, may comprise a low-dielectric constant material such as methyl silsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, or combinations thereof, as examples. Alternatively, the low-k dielectric layer 128 may comprise other low-dielectric constant materials, such as nanoporous silica, xerogel, polytetrafluoroethylene (PTFE), or low-dielectric constant (low-k) materials such as SiLK available from Dow Chemicals of Midland, Mich., Flare, available from Allied Signal of Morristown, N.J., and Black Diamond, available from Applied Materials of Santa Clara, Calif., as examples, although other low-k materials may also be used. The low-k dielectric layer 128 is preferably deposited using a chemical vapor deposition (CVD) or a spin-on coating technique, although other deposition techniques may alternatively be used. The low-k dielectric layer 128 is preferably deposited to a thickness of about 2,000 Å to about 9,000 Å, for example, although it may comprise other thicknesses. One skilled in the art will recognize that the preferred thickness range will be a matter of design choice and will likely decrease as device critical dimensions shrink and processing controls improve over time.

An ARC layer 140 is deposited on the low-k dielectric layer 128. The ARC layer 140 is deposited by PECVD using $SiH_4$ and $N_2O$ in a He carrier gas and is between about 200 and about 600 Angstroms thick. Process parameters for PECVD deposition of silicon oxynitride or a nitrogen-free dielectric are well known to those skilled in the art.

Photoresist 146 is applied and patterned to form a mask which defines a via opening 180 overlying the copper wiring 122. The ARC layer 140 serves as a BARC (bottom anti-reflective coating) during the photoresist exposure. The wafer 110 is then inserted in the etching chamber of a plasma etching tool, for example, a MERIE (magnetically enhanced reactive ion etching) tool.

Figure 2:
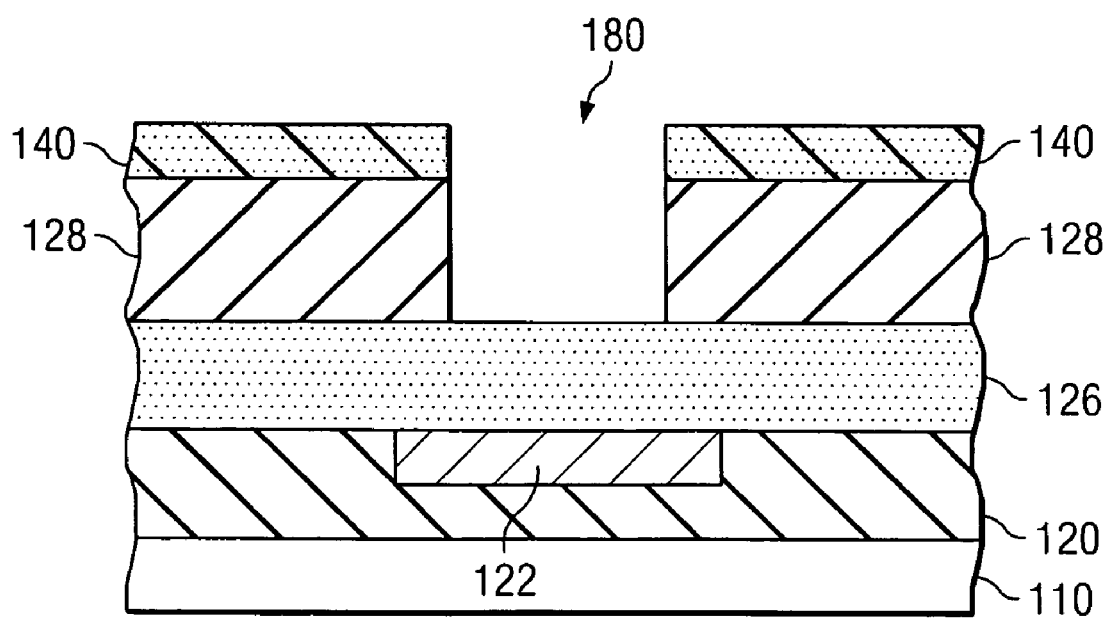

Turning now to FIG. 2, the via opening 180 is etched in a single operation, by reactive ion etching sequentially, through the ARC layer 140, the low-k dielectric layer 128, and stopping on the ESL 126. Reactant gas mixtures and etching parameters are adjusted for each layer to achieve a high etch rate for each layer as it is reached. An endpoint sensor, such as an optical emission spectrometer, provides continuous monitoring of the etching process and indicates when etchant gases are to be changed to accommodate either a nitride layer or an insulating layer. The nitride layers are etched with a gas mixture containing a fluorocarbon such as $CF_4$ and oxygen, while the insulating layers are etched with fluorocarbons alone, for example $CHF_3$ or $C_4F_8$. Etchant gas mixtures and plasma parameters for etching the various layers are well known to those in the art and may be experimentally optimized for each application. Stopping on the ESL 126 is easily achieved by utilizing etching parameters that provide high insulating layer-to-silicon nitride selectivity.

Any photoresist residue may be removed in a plasma ashing chamber. The plasma ashing chamber may be in a separate tool or it may also be a second chamber of the RIE tool. Ashing is preformed using an $O_2/N_2$ gas mixture. Oxygen is flowed at a rate of between about 20 and about 80 SCCM (standard cubic centimeters per minute) and $N_2$ at a flow rate of between about 20 and about 80 SCCM. The pumping speed is throttled to maintain the ashing chamber pressure at between about 50 and about 100 milliTorr. The temperature of the wafer is maintained at between about 40° C. and about 60° C. by controlling the temperature of a pedestal in the ashing tool upon which the wafer rests. In addition, the wafer is electrically biased to provide directionality to the plasma. During ashing a bias power of between about 500 and about 700 Watts is applied to the substrate to provide plasma directionality and the temperature of the wafer is maintained at between about 40° C. and about 60° C. by controlling the temperature of a pedestal in the ashing tool upon which the wafer rests.

Figure 3:
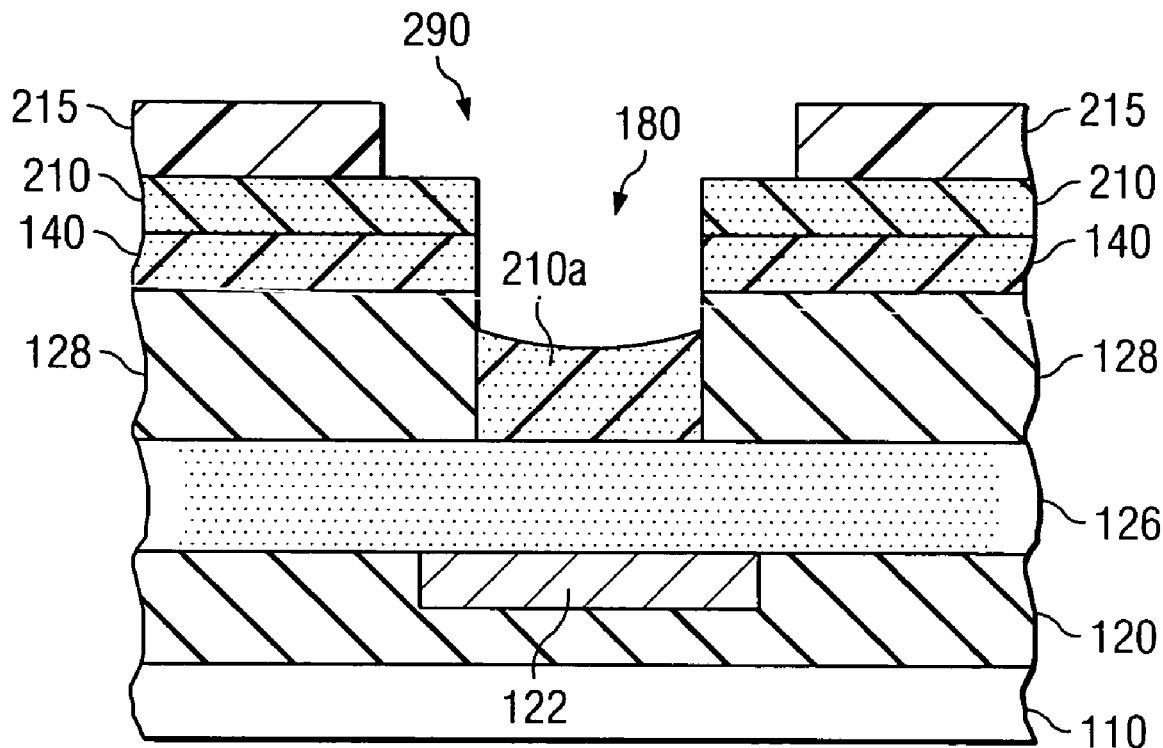

Referring next to FIG. 3, a bottom anti-reflective coating (BARC) is formed over the structure of FIG. 2. Although intended only for illustration and not for limitation, the method described here is so-called via first damascene process. The via first process includes forming via 180 first and then forming trench 290 later. Therefore, a sacrificial filler layer 210 filled in the via 180 is necessary to prevent damage at the bottom of the via during a subsequent process for trench portion 290 etching.

One skilled in the art understands that there are several techniques for manufacturing dual damascene structures such as via first fabrication, self-aligned fabrication, and trench first fabrication. All such methods are within the scope of embodiments of the invention. In a typical trench-first process, for example, conventional photolithographic processes using a photoresist layer is first used to expose and pattern an etching mask on the surface of a hard mask layer overlying a low-k insulating (IMD/ILD) layer, for etching trench openings through the low-k insulating layer. Subsequently a similar process is used to define via openings that are formed within the trench openings which in turn define metallization vias that are formed through another a second insulating layer. The via openings and trench openings are subsequently filled with metal, preferably copper, to form vias and trench lines (metal interconnect lines). The surface may then be planarized by conventional techniques such as chemical mechanical planarization (CMP) to remove excess metal and better define the trench lines and prepare the multilayer device for further processing.

Continuing with FIG. 3, any conventional organic material can be used as a sacrificial filler layer. BARC is of organic material and can be one of sacrificial filler. Typically, BARC 210*a* and BARC 210 are formed at the same time. Therefore BARC 210 may be on layer 140 or only a layer 210*a* exists in the via. Whether 210 is on layer 140 is dependent on the viscosity and the desired thickness of the BARC material (or organic sacrificial filler). If the thickness of the sacrificial filler is just only few nanometers, then the sacrificial filler may be not on 140 layer.

The BARC 210 may be formed by first depositing a liquid monomer onto the wafer from a nozzle as the wafer 110 is spun on a wafer spinner. This method of film deposition is well known and widely practiced in the art. The thickness of the BARC 210 is determined by the viscosity of the liquid monomer and the spinning speed of the wafer by a spin-on technique. The organic BARC 210 is thermally cured resulting in a final thickness of between about 1,000 and 4,000 Angstroms, which is dependent on a depth of the trench portion 290. A photoresist layer 215 is next patterned on the wafer 110 to define the wider or trench portion 290 of the dual damascene structure.

Embodiments may optionally include depositing BARC material within the via opening 180 as a sacrificial filler layer 210*a*. Sacrificial layer 210*a* protects the conductor 122 and the ESL 126 from damage caused by trench 290 formation.

Figure 4A:
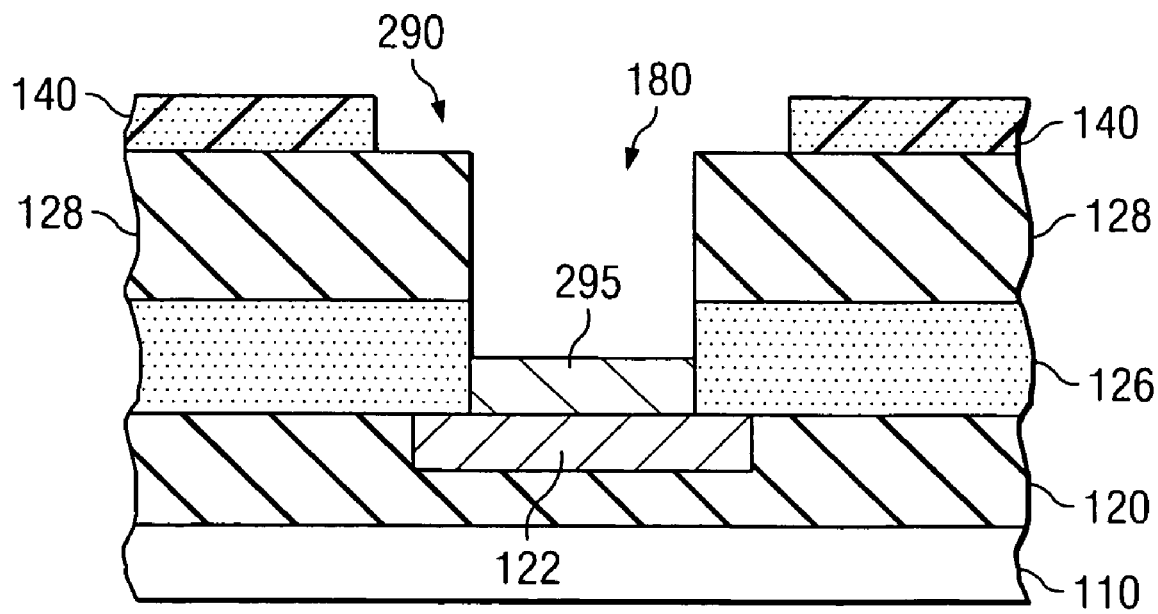
FIGS. 4A and 4B are cross sectional views illustrating alternative embodiments for damascene fabrication.

Referring now to FIG. 4A, the BARC 210 and the ARC layer 140 are etched to the ESL 126 thereby forming the trench 290. The etching process is accomplished in the same etching chamber that was previously used to form the via opening 180. The BARC 210 and residuals on the ESL 126 in the via opening 180 are removed with negligible attack of the low-k dielectric layers.

Figure 4B:
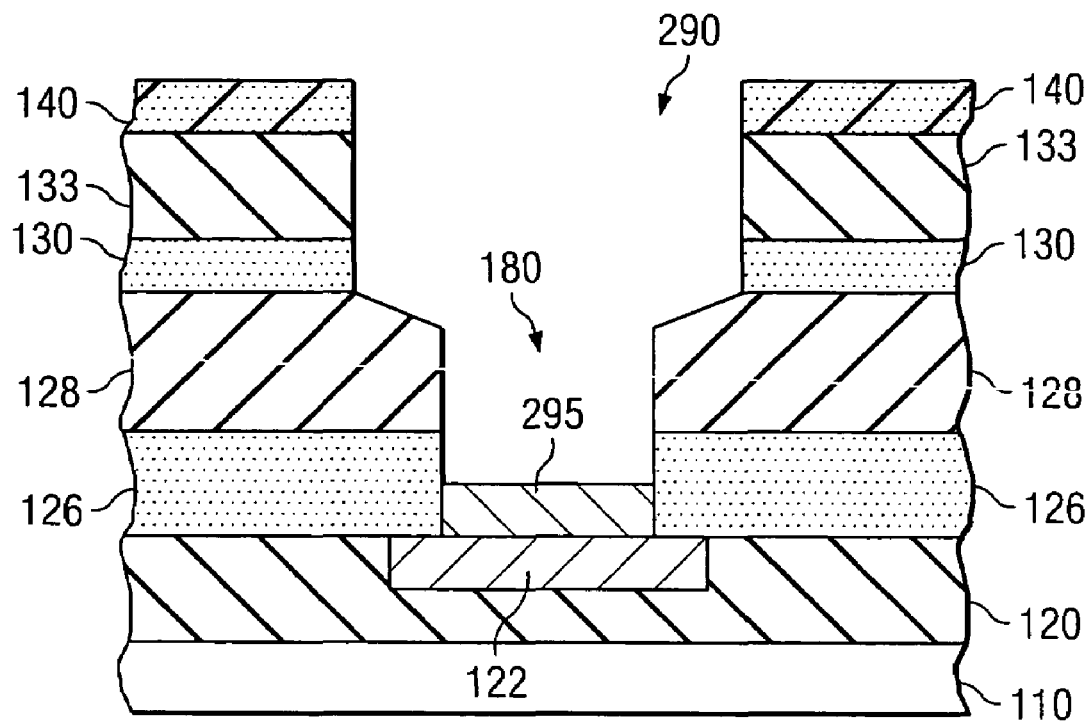

Referring to FIG. 4B for another embodiment, wherein a middle etch stop layer (MESL) 130 is employed as a buffer for trench portion 290 patterning. The BARC 210, the ARC layer 140, and a low-k organic layer 133 are etched to the MESL 130 thereby forming the trench 290. The etching process is accomplished in the same etching chamber that was previously used to form the via opening 180. An $O_2/N_2$ ashing treatment removes the ESL 126 in the via opening 180 as well as the exposed portions of the MESL 130 and the BARC 210 are removed with negligible attack of the low-k dielectric layers. The BARC 210 and the exposed MESL 130 are concurrently removed along with the exposed ESL 126.

FIG. 4 shows the one embodiment of the structure after forming the damascene trench 290 and via 180. A residue 295 may remain in the opening 180 after etching and/or ashing. The residue may comprise Cu—F and Cu—O polymers, which are formed at the end of the ESL 126 etching by reaction of the fluorocarbon etchant gases with the freshly exposed copper wiring 122 at the base of the via opening 180. In an alternate embodiment (not illustrated) when the wiring layer 122 is of another metal, corresponding residues may be formed by attack of the metal by the silicon nitride etchant gas. The residue 295 may also comprise dielectric materials remaining from incomplete etching or ashing. For example, the residue 295 may comprise a photoresist, a thin dielectric layer, or an ESL 126. The residue 295 is preferably removed from within the opening 180 prior to the copper damascene metallization in order to achieve a good ohmic contact with metal layer 122.

Figure 5:
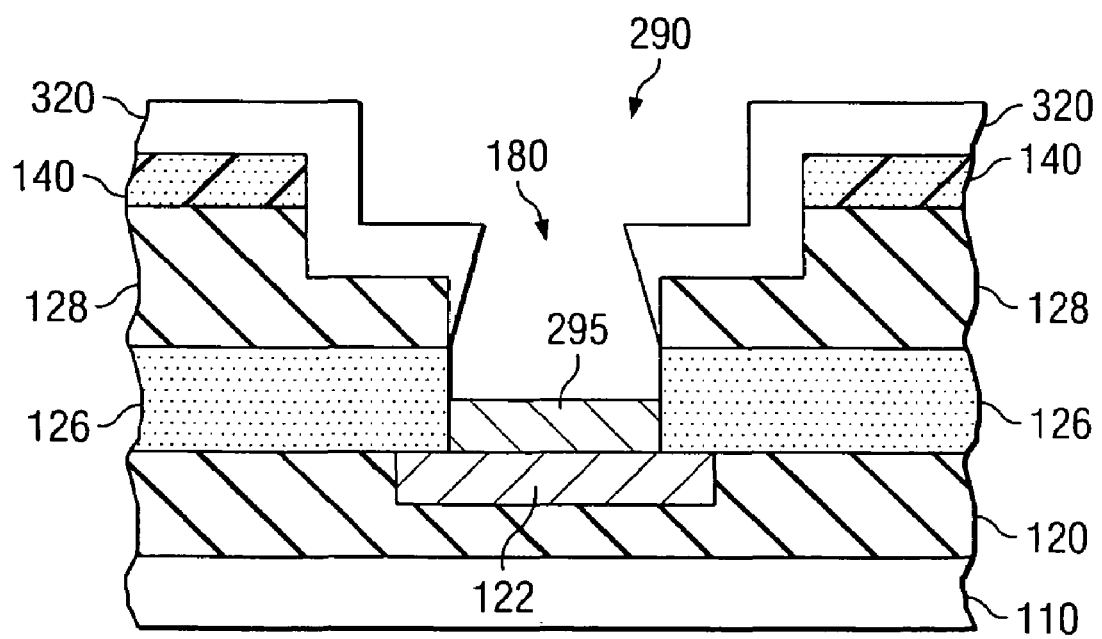
FIGS. 5-7 illustrate forming a pore sealing layer according to embodiments of the invention.

Referring now to FIG. 5, the damascene trench 290 and via 180 are lined with a pore sealing layer 320. The pore sealing layer 320 is preferably oxidized silicon carbon material (SiCO). Other materials such as silicon-containing materials such as amorphous hydrogenated silicon (a-Si:H), $SiO_xN_y$, SiC, SiCO, SiCH, SiCOH, and compounds of these materials may alternatively be used.

In preferred embodiments of the invention, the pore sealing layer 320 may be formed by a selective or nonselective deposition process. The deposition process may comprise chemical vapor deposition (CVD), sub atmospheric chemical vapor deposition (SACVD), by spin-on deposition (SOD). In the case of SACVD, an SiCO precursor such as tetramethyl silane (4MS), trimethyl silane (3MS), diethoxymethylsilane (DEMS), benzocyclobutene (BCB), tetraethyloxysilane (TEOS), methyltriethoxysilane (MTEOS), octamethylcyclotetrasiloxane (OMCTS), tetraoxymethylcyclotetrasiloxane (TOMCTS), may be used with $H_2$, $O_2$, $O_3$, $N_2$, or He. The flow rate may be between about 20 SCCM and about 2000 and the deposition time between about 1 and about 100 sec, depending on the thickness.

A preferred deposition process comprises SACVD using ozone and TEOS as the SiCO precursor. The preferred deposition process advantageously selectively deposits the pore sealing layer only on porous dielectric surfaces, thereby leaving non-dielectric surfaces substantially uncoated.

The pore sealing layer 320 process may cause the thickness of a top portion of the layer to be greater than a second portion as illustrated in FIG. 5. While portions of the dielectric layer may have a graded thickness, the pore sealing layer preferably has substantially uniform thickness over sidewalls of the damascene trench 290. In other embodiments the pore sealing layer has substantially uniform thickness over sidewalls of the trench 290 and via 180.

Figure 6:
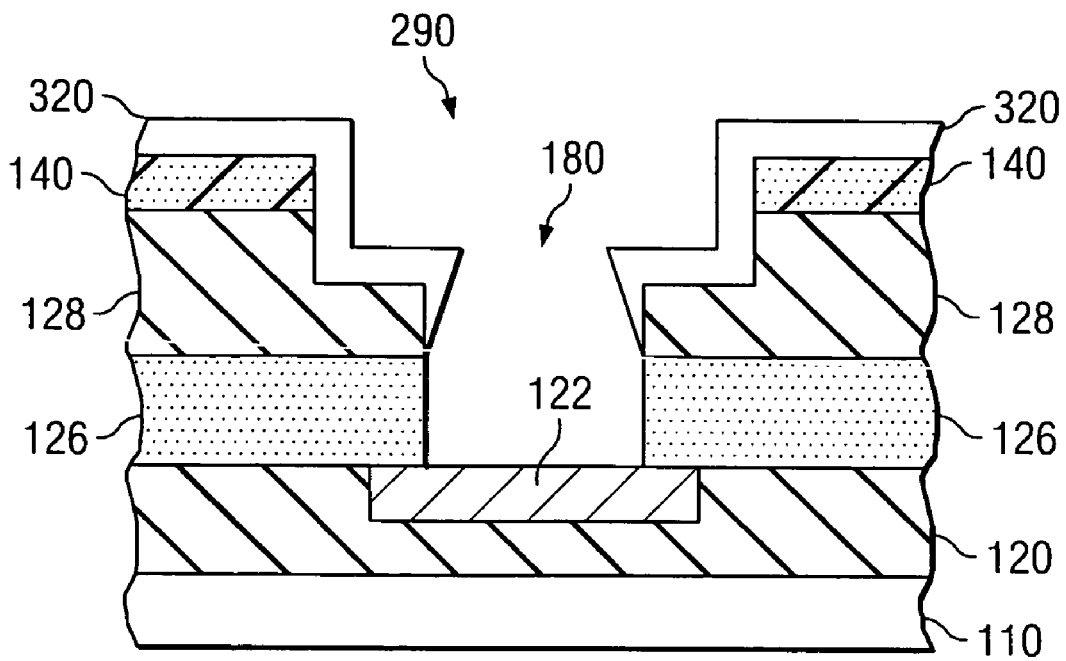

Turning now to FIG. 6, residues 295 (shown in FIG. 5) are removed with a $H_2/N_2$ plasma etch using a layer removal method (LRM). The a gas may comprise $H_2$ at a flow rate of between about 100 and about 500 SCCM and $N_2$ at a flow rate of between about 100 and about 850 SCCM. The chamber pumping speed is throttled to maintain a chamber pressure of between about 50 and about 250 milliTorr while the wafer temperature is maintained between about 25 and about 80° C. The $H_2/N_2$ plasma cleans away the copper polymer residues leaving a clean copper surface at the base of the via opening 180. The $H_2/N_2$ treatment is applied for a period of between about 10 and about 90 seconds. The residue 295 removal process may also reduce the thickness of the pore sealing layer 320. In other embodiments of the invention wherein there are no residues 295, an LRM is necessary.

Preferably, the pore sealing layer 320 thickness is less than about 300 Å, and more preferably between about 20 Å and about 250 Å. The deposition pressure is preferably less than about 20 torr, and the temperature between about 200° C. and about 400° C. The etch selectivity of the pore sealing layer 320 to the porous dielectric layer is preferably about 1 to about 1.5 (1:1.5). The etch selectivity of the pore sealing layer 320 to an ESL is preferably about 1.6 to about 1 (1.6:1).

Figure 7:
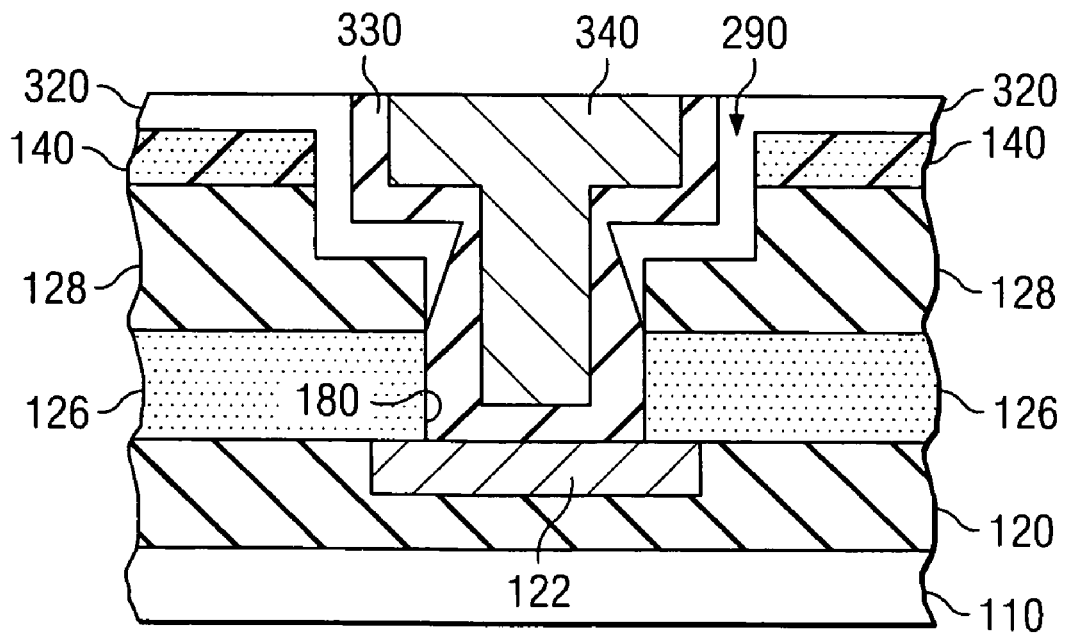

After forming a pore sealing layer according to embodiments of the invention, the damascene trench 290 and via 180 are lined with a barrier layer 330, as shown in FIG. 7. The barrier layer 330 formed over the sealing layer advantageously exhibits few breaks and has better continuity. The barrier layer is preferably about 10 to about 60 Angstroms thick, and it forms a barrier to Cu diffusion. The barrier layer 330 may include a metal nitride or nitrogen-rich metal nitride such as tantalum nitride (TaN), titanium nitride (TiN), tungsten nitride (WN), terbium nitride (TbN), vanadium nitride (VN), zirconium nitride (ZrN), chromium nitride (CrN), tungsten carbine (WC), tungsten carbon nitride (WCN), niobium nitride (NbN), aluminum nitride (AlN), and combinations thereof. In alternative embodiments the barrier layer 330 is metal rich, either throughout the bulk or only on the surface. In metal-rich, barrier layers, the ratio of nitrogen to metal is preferably less than about one (atomic ratio).

The barrier layer 330 may be applied using physical vapor deposition (PVD), chemical vapor deposition (CVD), plasma enhanced chemical vapor deposition (PECVD), or plasma enhanced atomic layer deposition (PEALD). In preferred embodiments, the barrier layer 330 comprises TaN, and it is deposited using atomic layer deposition (ALD) for a better reduction in capacitance and electromigration effects. In still other embodiments, the barrier layer 330 includes a Ta/TaN bi-layer structure. Ta/TaN bilayer embodiments include: PEALD TaN and ALD Ta, ALD TaN and PEALD Ta, or PEALD TaN and PEALD Ta.

Yet other embodiments may include an adhesive layer (not illustrated) between the barrier layer 330 and an overlaying conductor. The adhesive layer enhances adhesion between and adjacent layers. The adhesive layer preferably contains materials that bond with copper and/or the underlying barrier layer. It may be about 10 to about 500 Angstroms thick, preferably less than about 150 Å. It is also preferably metal-rich.

Continuing with FIG. 7, a layer of copper 340 is deposited to fill the openings 180 and 290. Deposition of the copper layer 340 may be by PVD (physical vapor deposition) methods such as sputtering or vacuum evaporation, or by CVD (chemical vapor deposition), or by ECD (electrochemical deposition). The ECD method involves placing the wafer into an electrolyte bath and electroplating a metal layer onto the wafer surface by applying of an electric field between the wafer and the electrolyte. The ECD method is desirable for the deposition of copper because of its superior gap-filling and step coverage. Following ECD deposition the structure is planarized by CMP to expose the dielectric layer 133 completing the formation of the damascene metallization and forming the structure of FIG. 7.

It should be noted that a damascene via and a trench are used as an opening for illustrative purposes only. Embodiments of the present invention may be used with other types of openings. It should also be noted that the via 120 is illustrated as a dual-damascene structure for illustrative purposes only and may be formed by one or more process steps (e.g., a single damascene process).

Figure 8A:
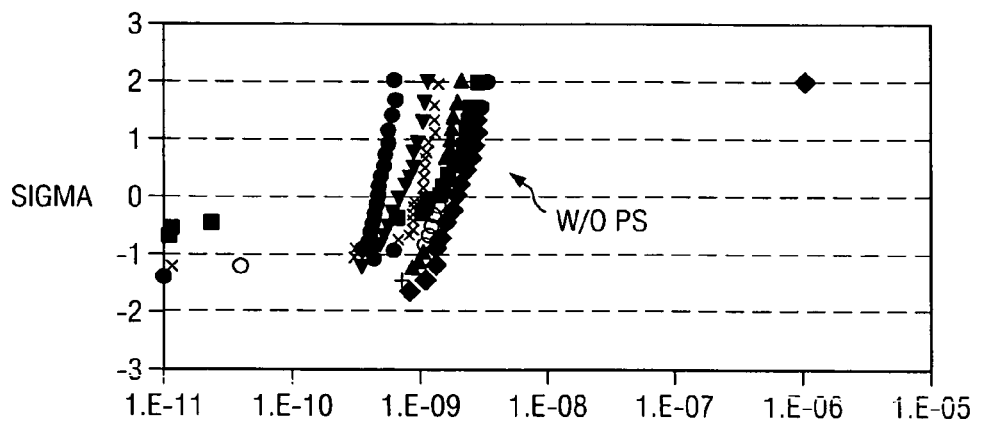
FIGS. 8A-8C are plots of line-to-line leakage of devices formed according to embodiments of the invention.
Figure 8B:
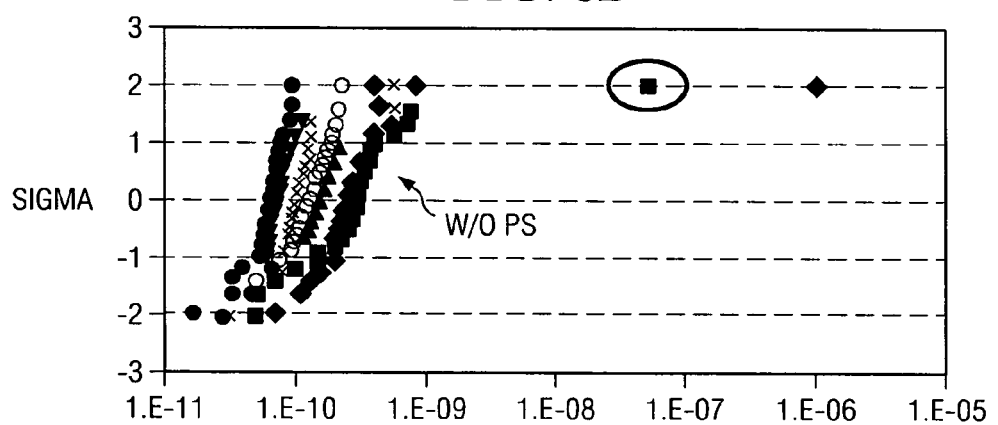
Figure 8C:
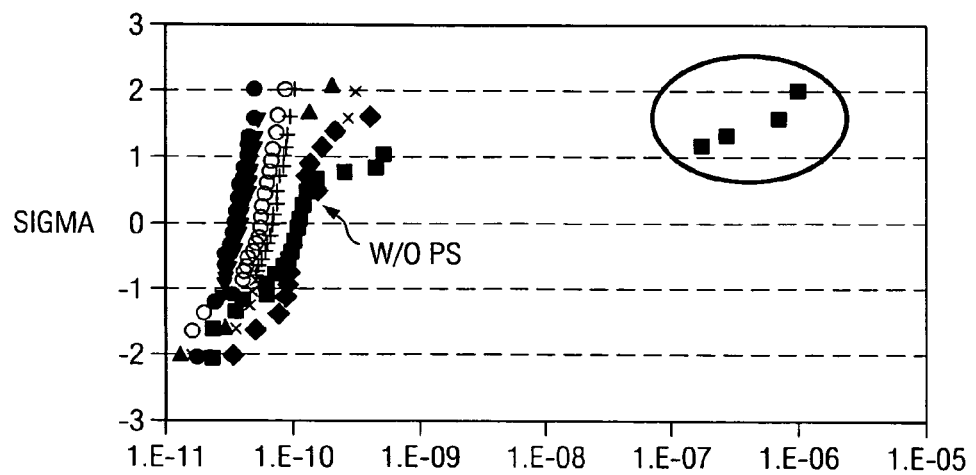
Figure 9A:
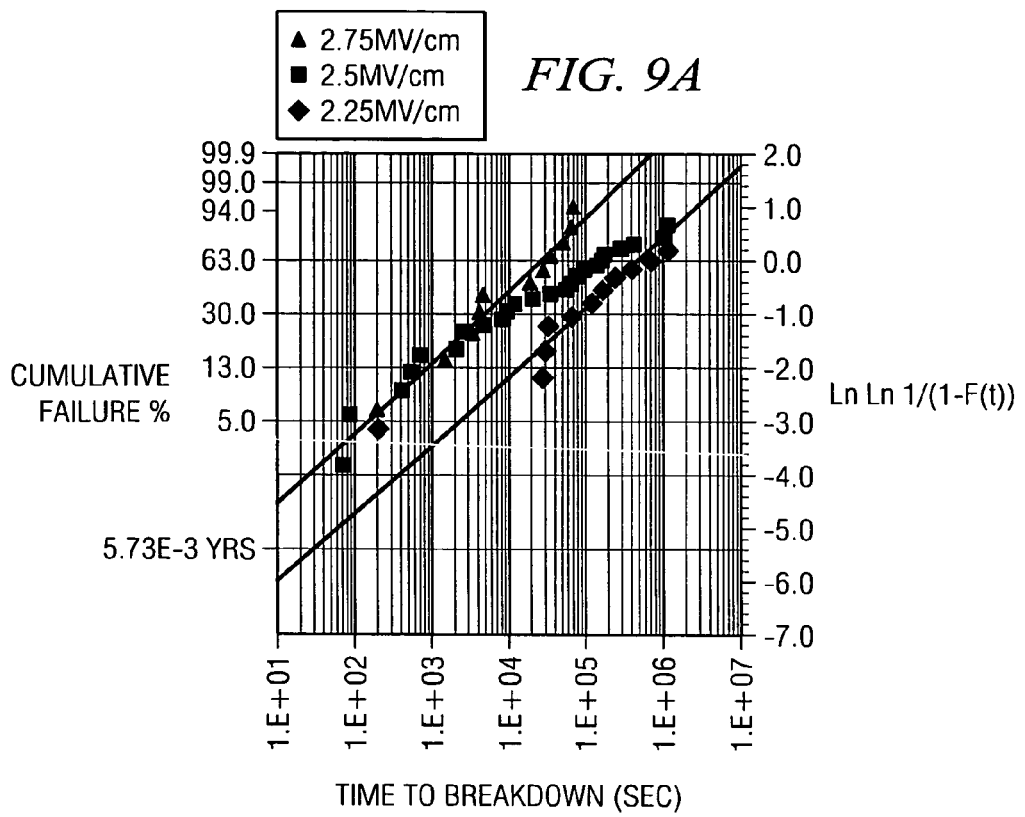
FIGS. 9A-9B are plots showing improved TDDB of devices formed according to embodiments of the invention.
Figure 9B:
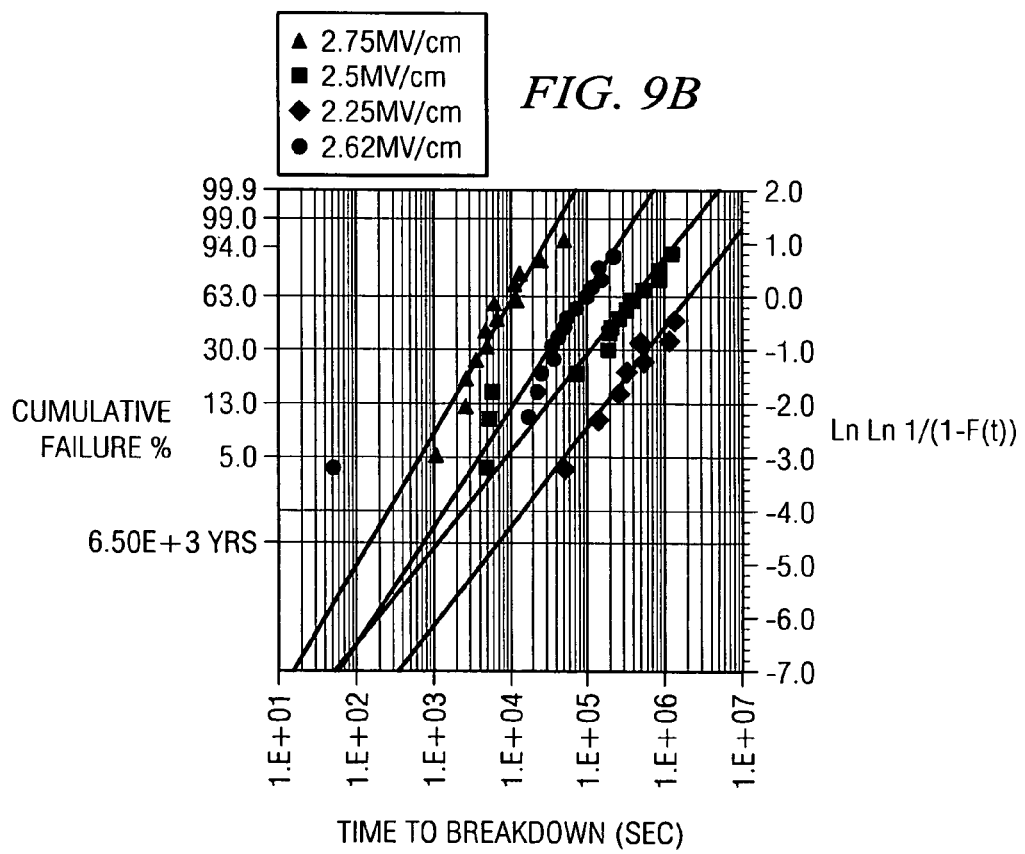
Figure 10:
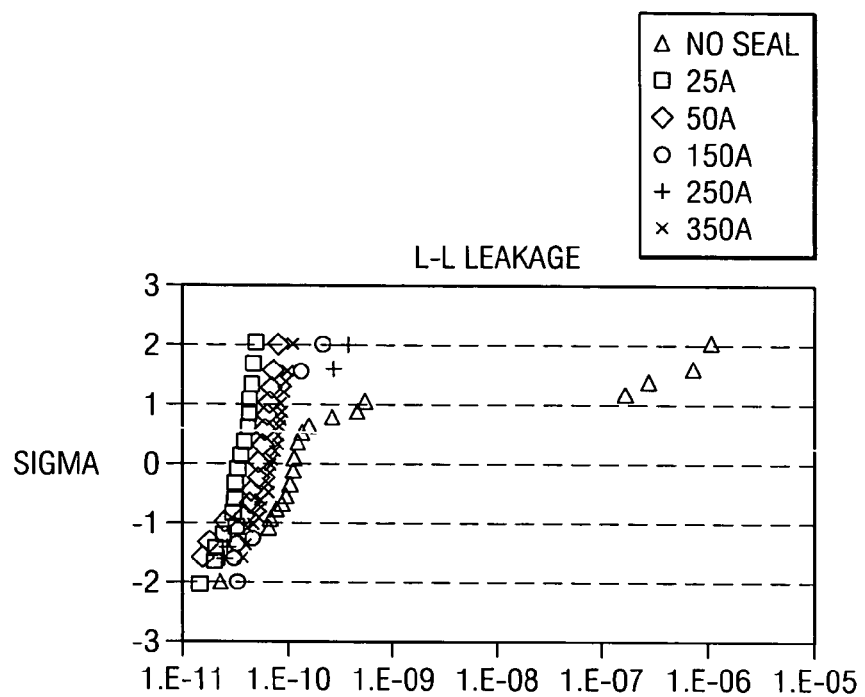
FIG. 10 is a plot showing line-to-line leakage versus sealing layer thickness.
Figure 11:
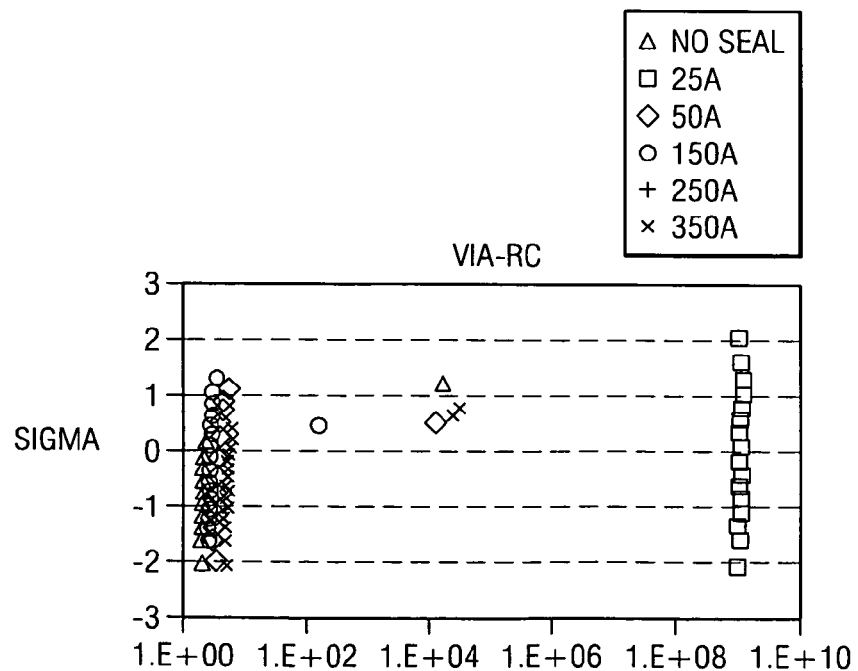
FIG. 11 is a plot showing via Rc versus sealing layer thickness.

Embodiments of the invention provide significant improvements over the prior art. For example, FIGS. 8A-8C show the reduction in line-to-line leakage for three different alloying cases. FIGS. 9A and 9B show the increase in time-dependent dielectric breakdown (TDDB) lifetime from about 5.73E−3 years to about 6.50E+3 years associated with embodiments of the invention. FIG. 10 shows the dependence of line-to-line leakage versus thickness of the sealing layer. FIG. 11 shows the dependence of via-Rc versus thickness of the sealing layer.

Applicants found that the intrinsic stress level within the pore sealing layer is only slightly higher than conventional low-k dielectrics. Typical approximate stress levels include: low-k dielectric 5E8-6E8 dyne/$cm^2$, sealing layer 5E8-8E8 dyne/$cm^2$, copper 3.5E9 dyne/$cm^2$, barrier layer −5E10 to −1E10 dyne/$cm^2$, etch stop layer 2E9-3E9 dyne/$cm^2$. Applicants also found that the pore sealing layer provides a barrier to metal diffusion. The pore sealing layer provides good step coverage over the patterned trench surface and also a polymer-free trench surface.

Although the present invention and its advantages have been described in detail, it should be understood that various changes, substitutions and alterations may be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a conductive feature formed in a substrate;
a porous dielectric layer over the substrate;
a first opening in the porous dielectric layer;
a second opening, above the first opening, wherein a portion of the second opening is formed over the conductive feature; and
a pore sealing layer along sidewalls of the first and second openings, comprising a dielectric material, wherein the pore sealing layer has a non-uniform thickness over the sidewalls of the first opening and a substantially uniform thickness over the sidewalls of the second opening, wherein the pore sealing layer completely covers the sidewalls of the first and second openings.

2. The semiconductor device of claim 1, wherein the first opening comprises a damascene interconnect via, and the second opening comprises a damascene interconnect trench, wherein the pore sealing layer has a substantially uniform thickness over sidewalls of the damascene interconnect trench.

3. The semiconductor device of claim 1, further comprising a surface treated layer interposed between the pore sealing layer and the sidewalls of the first and second openings.

4. The semiconductor device of claim 1, wherein an etch selectivity of the pore sealing layer to the porous dielectric layer is about 1 to about 1.5.

5. A semiconductor device comprising:
a substrate with a conductive region formed therein;
a non-porous dielectric layer over the substrate;
a porous dielectric layer over the non-porous dielectric layer;
a first opening through the non-porous dielectric layer and the porous dielectric layer, the first opening comprising first non-porous sidewalls along the non-porous dielectric layer and second porous sidewalls along the porous dielectric layer,
a second opening through the porous dielectric layer comprising third porous sidewalls;
a pore sealing layer, comprising a dielectric material, substantially completely covering the second porous sidewalls and the third porous sidewalls, wherein the first non-porous sidewalls are substantially clear of the pore sealing layer, and wherein the pore sealing layer has a non-uniform thickness over the second porous sidewalls and a substantially uniform thickness over the third porous sidewalls; and
a conductive material filling the first and second openings.

6. The semiconductor device of claim 5, wherein the first opening comprises a damascene interconnect via and the second opening comprises a damascene trench.

7. The semiconductor device of claim 5, further comprising a surface treated layer interposed between the pore sealing layer and the second and/or the third porous sidewalls.

8. The semiconductor device of claim 5, wherein an etch selectivity of the pore sealing layer to the porous dielectric layer is about 1 to about 1.5.

9. The semiconductor device of claim 5, wherein the pore sealing layer comprises a carbon-doped dielectric material.

10. The semiconductor device of claim 9, wherein the carbon-doped dielectric material is selected from the group consisting essentially of $Si_xC_yO_z$, $Si_xC_yO_zH_{(1-x-y-z)}$, $Si_xC_y$, $Si_xC_yN_z$, $Si_xC_yH_z$, $Si_xO_yN_z$, and combinations of these materials, wherein $1 \leq (x, y, z) \leq 9$.

11. The semiconductor device of claim 5, wherein the thickness of the pore sealing layer is less than about 300 Å thick.

12. The semiconductor device of claim 5, wherein the conductive material comprises a barrier material and copper.

13. The semiconductor device of claim 5, wherein the pore sealing layer has a substantially constant thickness along the third porous sidewalls and the pore sealing layer has a tapered profile along the second porous sidewalls.

14. A semiconductor device comprising:
a substrate with a conductive region formed therein;
a first dielectric layer comprising a non-porous material;
a second dielectric layer comprising a second material, the second material being porous;
an opening having first sidewalls through the first dielectric layer and second sidewalls through the second dielectric layer, wherein a transition within the opening between the first dielectric layer and the second dielectric layer is substantially planar;
a conductive material filling the opening and in contact with substantially the entire surface of the first sidewalls; and
a pore sealing layer, comprising a dielectric material, between the conductive material and the second dielectric layer;
a trench portion of the second sidewalls, wherein the pore sealing layer uniformly covers the second sidewalls alone the trench portion; and
a via portion of the second sidewalls, wherein the pore sealing layer has a tapered profile alone the second sidewalls.

15. The semiconductor device of claim 14, further comprising a surface treated layer interposed between the pore sealing layer and the second dielectric layer.

16. The semiconductor device of claim 14, wherein an etch selectivity of the pore sealing layer to the second material is about 1 to about 1.5.

17. The semiconductor device of claim 14, wherein the pore sealing layer comprises a carbon-doped dielectric material.

18. The semiconductor device of claim 17, wherein the carbon-doped dielectric material is selected from the group consisting essentially of $Si_xC_yO_z$, $Si_xC_yO_zH_{(1-x-y-z)}$, $Si_xC_y$, $Si_xC_yN_z$, $Si_xC_yH_z$, $Si_xO_yN_z$, and combinations of these materials, wherein $1 \leq (x, y, z) \leq 9$.

19. The semiconductor device of claim 14, wherein the thickness of the pore sealing layer is less than about 300 Å thick.

* * * * *

UNITED STATES PATENT AND TRADEMARK OFFICE
CERTIFICATE OF CORRECTION

PATENT NO. : 7,564,136 B2  Page 1 of 1
APPLICATION NO. : 11/361331
DATED : July 21, 2009
INVENTOR(S) : Yeh et al.

It is certified that error appears in the above-identified patent and that said Letters Patent is hereby corrected as shown below:

On the Title Page, Section (75) Inventors, 5$^{th}$ entry, delete "Cheng" and insert --Jeng--.
In Col. 10, line 41, Claim 14, delete "alone" and insert --along--.

Signed and Sealed this

Twenty-second Day of September, 2009

David J. Kappos
*Director of the United States Patent and Trademark Office*